US010707156B2

(12) United States Patent
Sato et al.

(10) Patent No.: US 10,707,156 B2
(45) Date of Patent: Jul. 7, 2020

(54) ELECTRONIC DEVICE

(71) Applicants: KATOH Electric Co., Ltd., Yamanashi (JP); TOREX SEMICONDUCTOR LTD., Tokyo (JP)

(72) Inventors: Shinya Sato, Yamanashi (JP); Yuki Yasuda, Yamanashi (JP); Yojiro Shiina, Tokyo (JP)

(73) Assignees: KATOH ELECTRIC CO., LTD., Yamanashi (JP); TOREX SEMICONDUCTOR LTD., Tokyo (JP)

(*) Notice: Subject to any disclaimer, the term of this patent is extended or adjusted under 35 U.S.C. 154(b) by 0 days.

(21) Appl. No.: 16/262,915

(22) Filed: Jan. 31, 2019

(65) Prior Publication Data

US 2019/0164872 A1 May 30, 2019

Related U.S. Application Data

(63) Continuation of application No. 15/793,142, filed on Oct. 25, 2017, now Pat. No. 10,242,937.

(30) Foreign Application Priority Data

Jan. 31, 2017 (JP) .................. 2017-016223

(51) Int. Cl.
*H01L 23/495* (2006.01)
*H01L 21/56* (2006.01)
(Continued)

(52) U.S. Cl.
CPC ........ *H01L 23/49568* (2013.01); *H01L 21/56* (2013.01); *H01L 23/49503* (2013.01);
(Continued)

(58) Field of Classification Search
CPC ............... H01L 23/49568; H01L 24/85; H01L 23/49503; H01L 21/56; H01L 24/49; H01L 24/49517; H01L 2224/48247
See application file for complete search history.

(56) References Cited

U.S. PATENT DOCUMENTS 6,388,311 B1   5/2002   Nakashima et al.
8,955,388 B2 * 2/2015   Mathew ................ G01N 3/24
                                                           73/827
(Continued)

FOREIGN PATENT DOCUMENTS

JP   2007-141994 A   6/2007
JP   2009-105301 A   5/2009
(Continued)

OTHER PUBLICATIONS

Office Action in JP Application No. 2017-016223, dated May 23, 2017, 12pp.
(Continued)

*Primary Examiner* — Dung A. Le
(74) *Attorney, Agent, or Firm* — Hauptman Ham, LLP

(57) ABSTRACT

An electronic device comprises a semiconductor chip, an accommodating part that accommodates the semiconductor chip, a plurality of terminals that are provided along a first side of a first surface and along a second side opposite to the first side with respect to the semiconductor chip, the plurality of terminals being electrically connected to the semiconductor chip and being exposed on the rectangular first surface of the accommodating part, and a plurality of conductive members that penetrate from the first surface of the accommodating part to the second surface opposite to the first surface.

8 Claims, 17 Drawing Sheets

(51) Int. Cl.
*H01L 23/00* (2006.01)
*H01L 23/31* (2006.01)

(52) U.S. Cl.
CPC .. *H01L 23/49517* (2013.01); *H01L 23/49541* (2013.01); *H01L 23/49575* (2013.01); *H01L 24/49* (2013.01); *H01L 24/85* (2013.01); *H01L 21/568* (2013.01); *H01L 23/3107* (2013.01); *H01L 24/45* (2013.01); *H01L 2224/16245* (2013.01); *H01L 2224/45147* (2013.01); *H01L 2224/48247* (2013.01); *H01L 2224/49171* (2013.01); *H01L 2224/73265* (2013.01); *H01L 2224/92247* (2013.01); *H01L 2924/15747* (2013.01)

(56) References Cited

U.S. PATENT DOCUMENTS

| | | |
|---|---|---|
| 2009/0127691 A1 | 5/2009 | Lee |
| 2009/0224381 A1 | 9/2009 | Ishihara et al. |
| 2009/0267207 A1 | 10/2009 | Koide et al. |
| 2013/0181336 A1 | 7/2013 | Talbot et al. |
| 2016/0141232 A1 | 5/2016 | Cannon |

FOREIGN PATENT DOCUMENTS

| | | |
|---|---|---|
| JP | 2013-213143 A | 10/2013 |
| JP | 5968827 B2 | 8/2016 |
| JP | 2016-162964 A | 9/2016 |
| JP | 2017-175000 A | 9/2017 |
| TW | 488555 U | 5/2002 |

OTHER PUBLICATIONS

Office Action in JP Application No. 2017-016223, dated Oct. 3, 2017, 5pp.
Office Action in TW Application No. 106134407, dated Jan. 18, 2018, 7pp.

* cited by examiner

200

| | | Mounting method of semiconductor chip | | | Form of copper post | | |
|---|---|---|---|---|---|---|---|
| | Die attach film | chip-stack | MCP | FC | a pair of copper posts | a plurality of pairs of copper posts | WB connection of copper posts |
| with die pad | ○ | ○ | ○ | ○ | ○ | ○ | ○ |
| without die pad | ○ | ○ | ○ | — | ○ | ○ | ○ |

FIG. 16

ELECTRONIC DEVICE

CROSS-REFERENCE TO RELATED APPLICATIONS

The present application is a continuation application of Ser. No. 15/793,142, filed on Oct. 25, 2017, which claims the benefit of Japanese Priority Patent Application No. 2017-016223, filed Jan. 31, 2017. The contents of all above-listed applications are incorporated herein by reference in their entirety.

BACKGROUND OF THE INVENTION

The present invention relates to an electronic device including a semiconductor, and a method for manufacturing the electronic device. Semiconductor packages capable of having other electronic elements mounted on the semiconductor package are known. Japanese Patent No. 5968827 discloses a semiconductor package having terminals with the same thickness as a die pad and terminals with a thickness larger than that of the die pad by using a leadframe having regions with different thicknesses.

The configuration of the semiconductor package disclosed in Japanese Patent No. 5968827 allows other electronic elements to be mounted on the semiconductor package by exposing terminals having a thickness larger than that of the die pad on the upper surface of the semiconductor package.

However, the cross-sectional area of the terminal of the conventional semiconductor package for connecting with other electronic elements is almost as large as the cross-sectional area of the other terminal that is unexposed on the upper surface of the semiconductor package.

Thus, there are problems that heat dissipation of an electronic device is insufficient when an electronic element that allows a large current to flow is mounted on the semiconductor package and that it is difficult to reduce the size of electronics.

BRIEF SUMMARY OF THE INVENTION

This invention focuses on these points, and an object of the invention is to improve heat dissipation properties of an electronic device capable of mounting an electronic element on an upper surface of a semiconductor package.

An electronic device of the present invention comprises a semiconductor chip, an accommodating part that accommodates the semiconductor chip, a plurality of terminals that are provided along a first side of a first surface and along a second side opposite to the first side with respect to the semiconductor chip, the plurality of terminals being electrically connected to the semiconductor chip and being exposed on the rectangular first surface of the accommodating part, the rectangular first surface being the side opposite to the side of the accommodating part where the semiconductor chip is placed; and a plurality of conductive members that penetrate from the first surface of the accommodating part to the second surface opposite to the first surface, the plurality of conductive members functioning as lands for mounting an electronic component, wherein the plurality of conductive members are provided at positions closer to a third side and a fourth side where the plurality of terminals electrically connected to the semiconductor chip are not provided than to the positions where the plurality of terminals are provided, the third side and the fourth side being orthogonal to the first side.

BRIEF DESCRIPTION OF THE DRAWINGS

FIG. 16 is a table showing an example of the scope of application of the present invention.

DETAILED DESCRIPTION OF THE INVENTION

Hereinafter, the present invention will be described through exemplary embodiments of the present invention, but the following exemplary embodiments do not limit the invention according to the claims, and not all of the combinations of features described in the exemplary embodiments are necessarily essential to the solution means of the invention.

First Exemplary Embodiment

Outline of Electronic Device 100

Figure 1A:
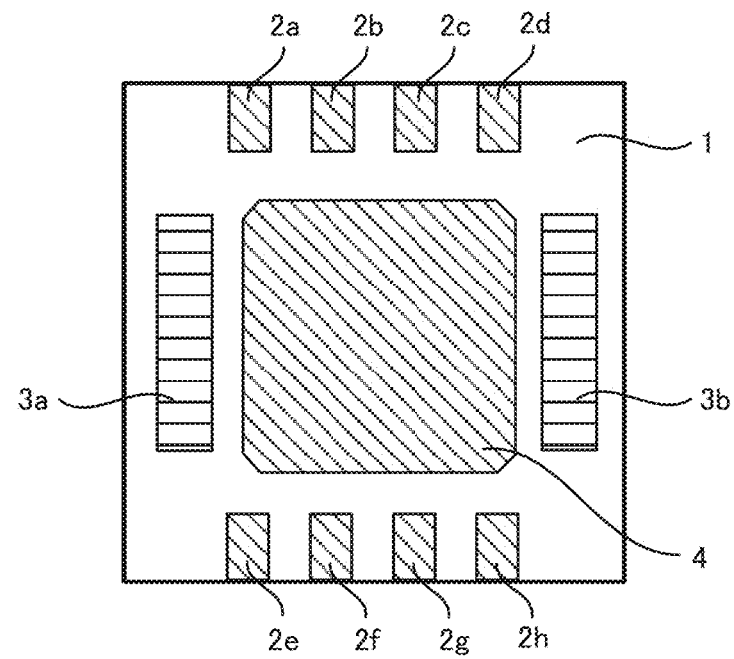
FIGS. 1A to 1C are external views of an electronic device according to a first exemplary embodiment.
Figure 1B:
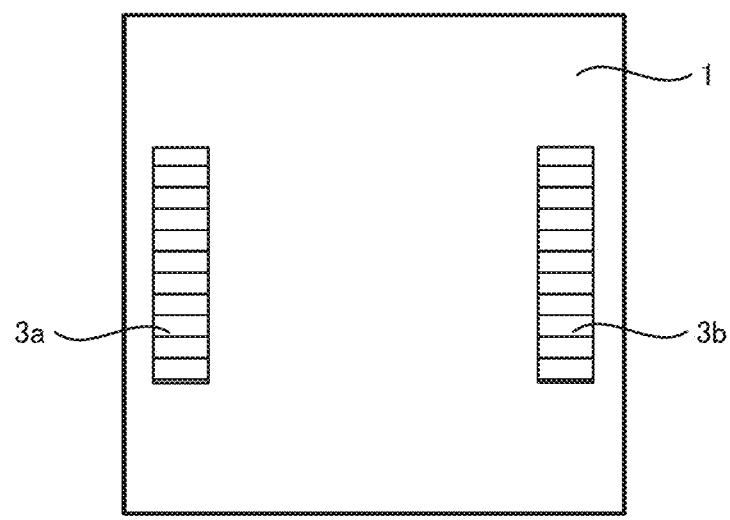
Figure 1C:
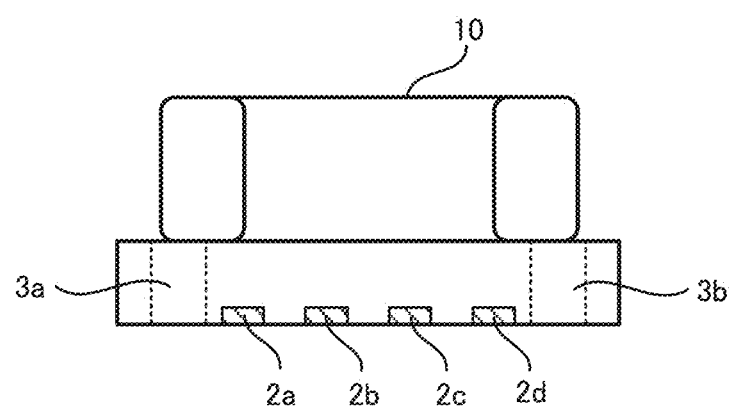

FIGS. 1A to 1C are external views of an electronic device 100 according to a first exemplary embodiment. FIG. 1A shows a lower surface (a first surface) of the electronic device 100. FIG. 1B shows an upper surface (a second surface) of the electronic device 100. FIG. 1C is a side view showing a state where an electronic component 10 is mounted on the upper surface of the electronic device 100. The electronic device 100 has, for example, a Small Outline Non-leaded (SON) package or a Quad-flat no-leads (QFN) type package structure.

The lower surface and the upper surface of the electronic device 100 are rectangular. As shown in FIG. 1A, a package 1, a plurality of terminals 2 (2a to 2h), copper posts 3 (3a and 3b), and a back surface of a die pad 4 are exposed on the lower surface of the electronic device 100. On a front surface of the die pad 4, a semiconductor chip that is built in the electronic device 100 is provided. As shown in FIG. 1B, the package 1 and the copper posts 3 (3a and 3b) are exposed on the upper surface of the electronic device 100. The electronic component 10 is electrically coupled to the copper post 3a and the copper post 3b.

The package 1 is an accommodating part for accommodating a semiconductor chip therein. The package 1 is formed of, for example, resin, but the material of the package 1 is freely selected. The terminal 2, which is formed of a conductive material, is electrically coupled with the semiconductor chip inside of the package 1. The terminal 2 is exposed on the lower surface of the package 1, and is soldered when the electronic device 100 is mounted on a printed circuit board.

As shown in FIG. 1C, the copper post 3 is made of a rod-like conductive member that penetrates from the lower surface to the upper surface of the package 1. A surface of the copper post 3 exposed on the upper surface of the electronic device 100 functions as a land for mounting various electronic components 10 such as an inductor, a capacitor, a resistor, and a semiconductor device.

The cross-sectional area of the copper post 3 in the horizontal direction, that is, the direction parallel to the first surface or the second surface, is larger than the cross-sectional area of the terminal 2 in the horizontal direction. Thus, the current capacity of the copper post 3 is larger than the current capacity of the terminal 2, and so the user of the electronic device 100 can mount, on the electronic device 100, the electronic component 10 that allows a large current to flow. The user can configure a small DC/DC converter by, for example, mounting the inductor on the upper surface of the electronic device 100 that incorporates a semiconductor chip 5 including a transistor for switching current.

As shown in FIG. 1C, the plurality of terminals 2 is exposed on the side surface of the electronic device 100, but the copper posts 3 are unexposed on the side surfaces of the electronic device 100. Since the copper posts 3 are unexposed on the side surfaces of the electronic device 100, a signal to be supplied to the electronic component 10 mounted on the upper surface of the electronic device 100 does not appear on the side surfaces of the electronic device 100. This allows the user to achieve miniaturization of an apparatus by using the electronic device 100 because the current flowing through the copper post 3 hardly influences other electronic devices even when the other electronic device is arranged close to the electronic device 100.

Internal Configuration of Electronic Device 100

Figure 2A:
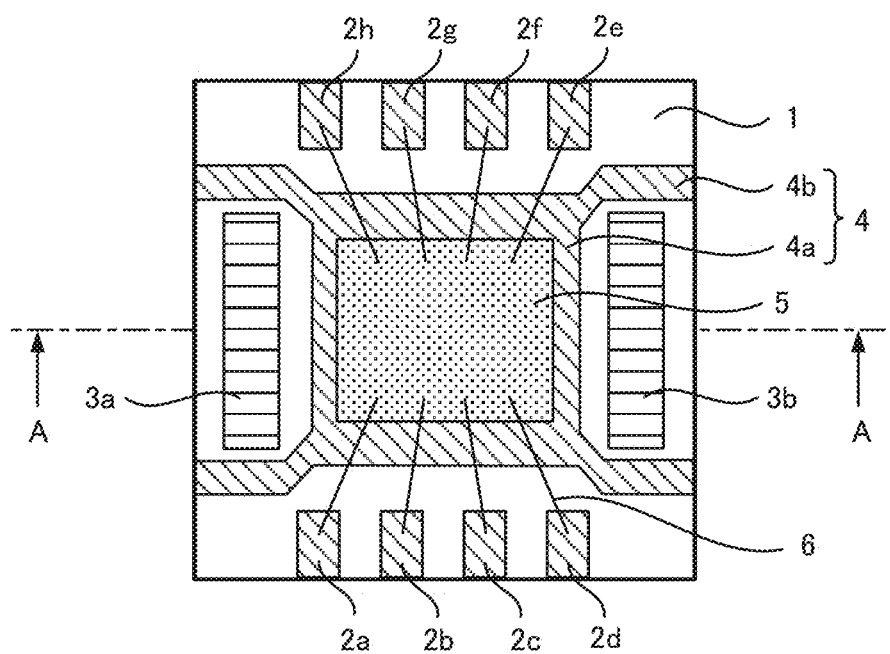
FIGS. 2A and 2B are diagrams for describing an internal configuration of the electronic device according to the first exemplary embodiment.
Figure 2B:
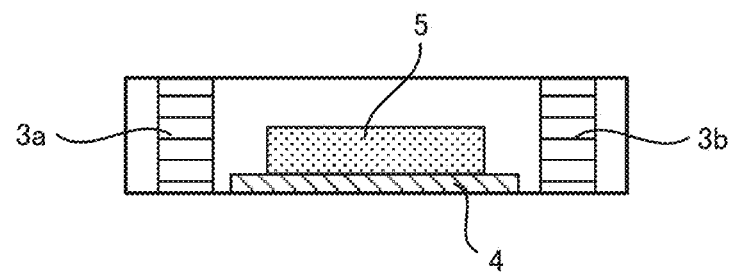

FIGS. 2A and 2B are diagrams for describing an internal configuration of the electronic device 100. FIG. 2A is a schematic perspective view showing an inside configuration of the electronic device 100 as seen from the upper surface side thereof. FIG. 2B is a cross-sectional view of the electronic device 100 taken along line A-A. As shown in FIGS. 2A and 2B, the electronic device 100 includes the die pad 4, the semiconductor chip 5, and bonding wires 6.

The die pad 4 is a plate-like member on which the semiconductor chip 5 is placed, and is formed of a conductive member made of the same material as the terminal 2. The bonding wire 6 is a wire formed of a conductive member for coupling the semiconductor chip 5 and the terminal 2.

As shown in FIG. 2A, the plurality of terminals 2 is provided on a first side of the first surface and on a second side opposite to the first side with respect to the semiconductor chip 5. Further, the copper post 3a and the copper post 3b are provided on a third side of the first surface or on a fourth side opposite to the third side with respect to the semiconductor chip 5. The die pad 4 includes a first region (hereafter referred to as a die pad region 4a) for placing the semiconductor chip 5 and a second region (hereafter referred to as a separation region 4b) for separating the plurality of terminals from the plurality of conductive members.

The separation region 4b is a region corresponding to a suspension lead for connecting the die pad region 4a to an outer peripheral portion of a leadframe, which will be described later, and is thinner than the die pad region 4a because the lower surface side of the electronic device 100 is half-etched. Thus, the separation region 4b is unexposed on the lower surface of the electronic device 100, as shown in FIG. 1A.

The die pad region 4a is substantially rectangular. The separation region 4b includes a plurality of regions extending from the die pad region 4a i) between the terminal 2a and the copper post 3a, ii) between the terminal 2h and the copper post 3a, iii) between the terminal 2d and the copper post 3b, and iv) between the terminal 2e and the copper post 3b. Since the electronic device 100 has the separation region 4b separating the plurality of terminals 2 and the plurality of copper posts 3, the electronic device 100 can suppress interference between a signal that is inputted to or outputted from the terminal 2 and a signal that is inputted to or outputted from the copper post 3.

Method for Manufacturing Electronic Device 100

Figure 3:
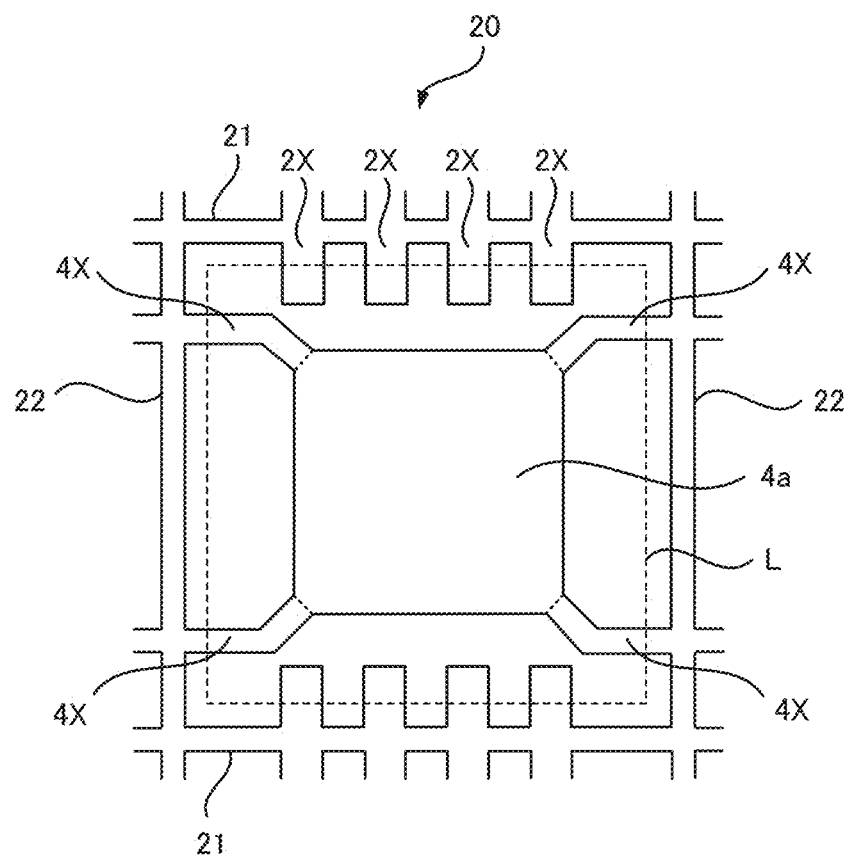
FIG. 3 is a diagram showing an outer shape of a leadframe used in the process of manufacturing the electronic device according to the first exemplary embodiment.

FIG. 3 is a diagram showing an outer shape of a leadframe 20 used in the process of manufacturing the electronic device 100. As shown in FIG. 3, a plurality of terminal regions 2X where the plurality of terminal 2 is formed is connected to a horizontal crossbar 21. Further, the die pad region 4a is connected to a vertical crossbar 22 via a suspension lead 4X. In the following description, the horizontal crossbar 21 and the vertical crossbar 22 may be referred to as outer peripheral portions in some cases. A broken line L in FIG. 3 indicates a position to be cut in the dicing process. By cutting the leadframe 20 at the position of the broken line L, the terminal 2 and the die pad 4 are electrically insulated as shown in FIG. 2A.

Figure 4A:
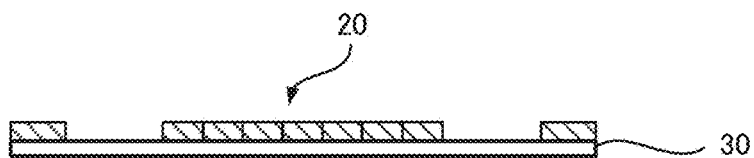
FIGS. 4A to 4G are diagrams for describing a method for manufacturing the electronic device according to the first exemplary embodiment.

FIGS. 4A to 4G are diagrams for describing a method for manufacturing the electronic device 100. First, as shown in FIG. 4A, a film 30 coated with an adhesive is prepared. Subsequently, a leadframe 20 having the terminal region 2X where the terminal 2 is formed, the die pad region 4a where the die pad 4 is formed, and the suspension lead 4X is placed on the film 30. Because the adhesive is applied to the film 30, the leadframe 20 is fixed to the film 30.

Figure 4B:
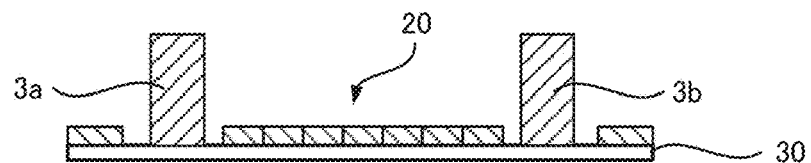
Figure 4C:
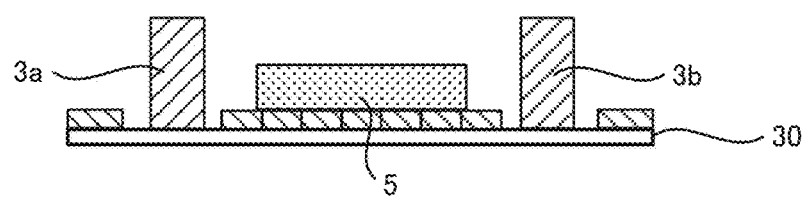

Next, as shown in FIG. 4B, the copper post 3a and the copper post 3b are placed on the inner side of the outer peripheral portion of the leadframe 20 on the film 30 where there is no leadframe 20. Then, as shown in FIG. 4C, an adhesive is applied to the die pad area of the leadframe 20, and the semiconductor chip 5 is placed on the adhesive, whereby the semiconductor chip 5 is fixed to the die pad area.

Figure 4D:
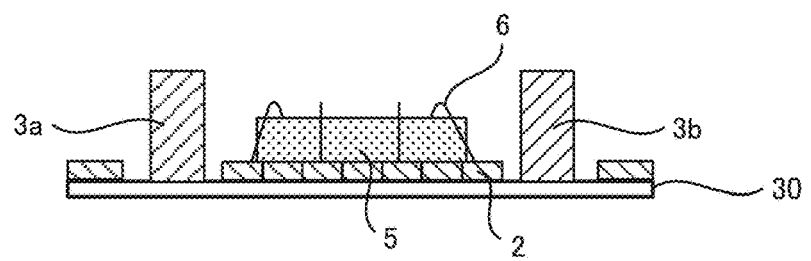
Figure 4E:
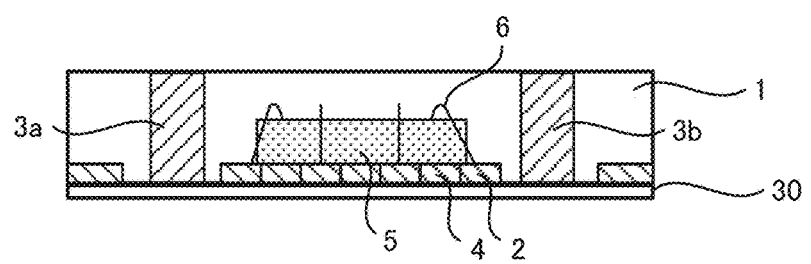

Next, as shown in FIG. 4D, the terminal 2 and the semiconductor chip 5 on the leadframe 20 are connected by the bonding wires 6. Subsequently, as shown in FIG. 4E, by injecting resin to cover the semiconductor chip 5, the package 1 is formed. Since the suspension lead 4X is half-etched and is thinner than the die pad region 4a, the package 1 is filled to cover the lower surface of the suspension lead 4X.

Figure 4F:
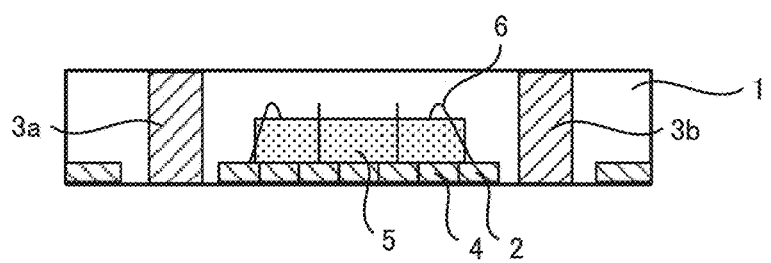
Figure 4G:
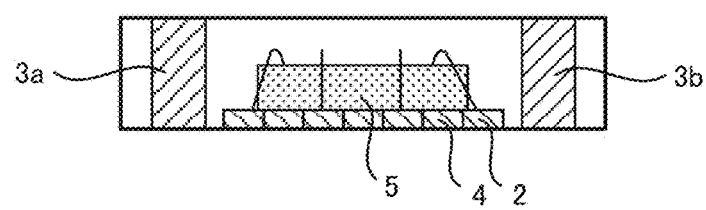

Next, as shown in FIG. 4F, the film 30 is removed. Finally, as shown in FIG. 4G, the dicing for cutting the leadframe 20 and the package 1 is performed at a position between the plurality of copper posts 3 and the outer peripheral portion of the leadframe 20. Specifically, the dicing is performed at the position indicated by the broken line L in FIG. 2. Through the above steps, the electronic device 100 is completed.

It should be noted that, among the above-described steps, the order of executing the step of placing the copper post 3a and the copper post 3b on the film 30 and the step of placing the semiconductor chip 5 on the die pad region of the leadframe 20 can be freely selected. Alternatively, the dicing may be performed without removing the film 30 in FIG. 4F, and then the film 30 may be removed after the dicing.

The present invention can be applied to various electronic devices having i) different positions or shapes of the terminal 2, the copper post 3 and the die pad 4 and ii) different numbers, mounting methods, and shapes of the semiconductor chip 5. Hereafter, examples of other various electronic devices will be described. In the following description, the same configuration as that of the electronic device 100 and the description of the configuration obvious to those skilled in the art will be omitted, and the configuration unique to each electronic device will be mainly described.

Second Exemplary Embodiment

Figure 5A:
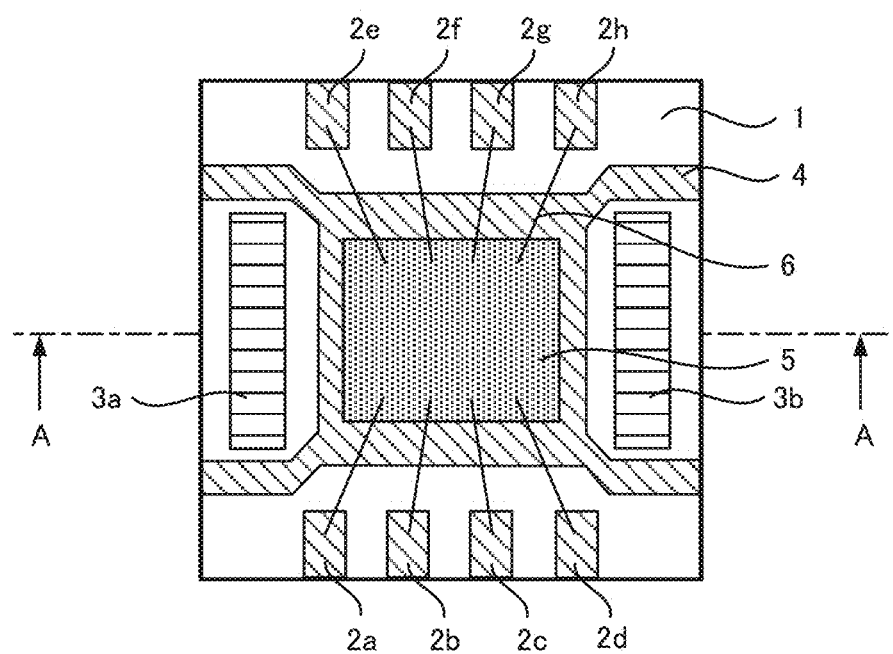
FIGS. 5A and 5B are internal configuration diagrams of the electronic device according to a second exemplary embodiment.
Figure 5B:
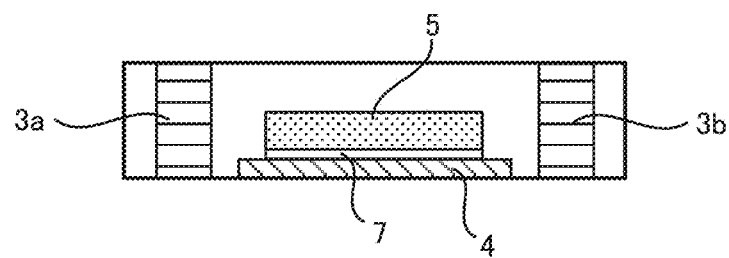

FIGS. 5A and 5B are diagrams for describing an internal configuration of an electronic device 200 according to a second exemplary embodiment. FIG. 5A is a schematic perspective view showing an inside configuration of the electronic device 200 as seen from the upper surface side thereof. FIG. 5B is a cross-sectional view of the electronic device 200 taken along line A-A. FIG. 5A is substantially the same as FIG. 2A.

As shown in FIG. 5B, the electronic device 200 is different from the electronic device 100 shown in FIG. 2B in that a die attach film 7 is provided between the die pad 4 and the semiconductor chip 5, and is the same in other respects. The manufacturing method of the electronic device 200 is different from the manufacturing method of the electronic device 100 in that, when placing the semiconductor chip 5 on the die pad 4, the die attach film 7 is first attached to the lower surface of the semiconductor chip 5 and then the semiconductor chip 5 is placed on the die pad 4, and is the same in other respects.

Third Exemplary Embodiment

Figure 6A:
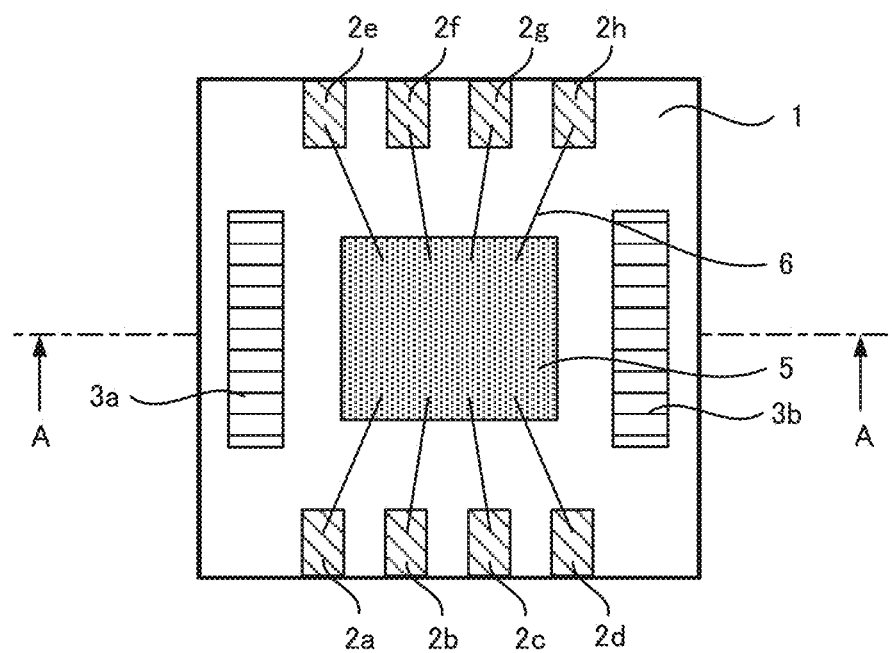
FIGS. 6A and 6B are internal configuration diagrams of the electronic device according to a third exemplary embodiment.
Figure 6B:
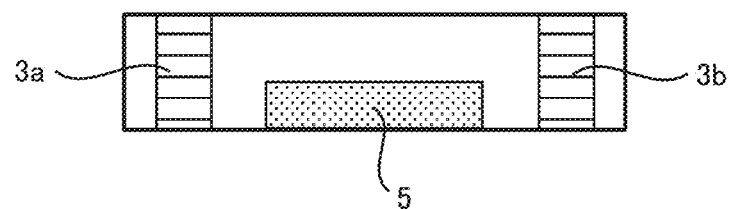

FIGS. 6A and 6B are diagrams for describing an internal configuration of an electronic device 300 according to a third exemplary embodiment. FIG. 6A is a schematic perspective view showing an inside configuration of the electronic device 300 as seen from the upper surface side thereof. FIG. 6B is a cross-sectional view of the electronic device 300 taken along line A-A.

The electronic device 300 is different from the electronic device 100 shown in FIG. 2A in that the electronic device 300 has no die pad 4 as shown in FIG. 6A, and is the same in other respects. The electronic device 300 has the semiconductor chip 5 exposed on the lower surface of the package 1 as shown in FIG. 6B.

The manufacturing method of the electronic device 300 uses a leadframe that has neither the die pad region 4a nor the suspension lead 4X of the leadframe 20 shown in FIG. 3, but has the terminal region 2X of the leadframe 20 shown in FIG. 3. After preparing the film 30 coated with the adhesive, the leadframe is placed on the film 30 and the copper post 3 and the semiconductor chip 5 are placed on the film 30. The manufacturing method of the electronic device 300 is different from the manufacturing method of the electronic device 100 described with reference to FIGS. 4A to 4G in that the semiconductor chip 5 is placed directly on the film 30, and the other steps are the same as the manufacturing method of the electronic device 100.

Fourth Exemplary Embodiment

Figure 7A:
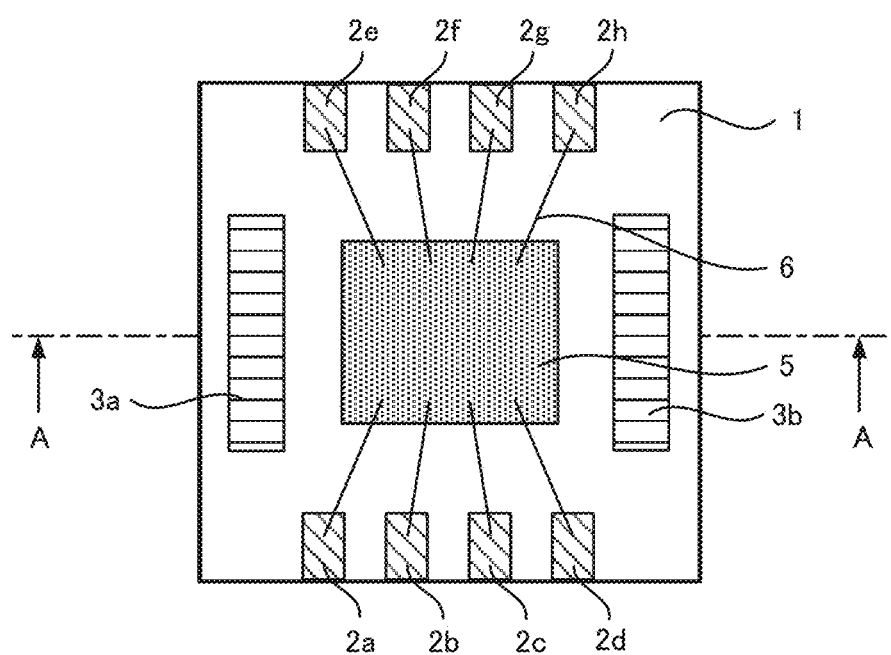
FIGS. 7A and 7B are internal configuration diagrams of the electronic device according to a fourth exemplary embodiment.
Figure 7B:
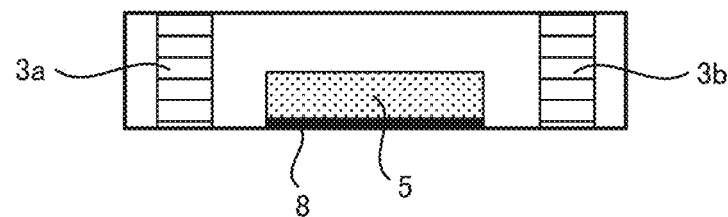

FIGS. 7A and 7B are diagrams for describing an internal configuration of an electronic device 400 according to a fourth exemplary embodiment. FIG. 7A is a schematic perspective view showing an inside configuration of the electronic device 400 as seen from the upper surface side thereof. FIG. 7B is a cross-sectional view of the electronic device 400 taken along line A-A. FIG. 7A is substantially the same as FIG. 6A.

The electronic device 400 is different from the electronic device 300 shown in FIG. 6B in that a black single-sided adhesive tape 8 is affixed to the electronic device 400 below the semiconductor chip 5 as shown in FIG. 7B. The manufacturing method of the electronic device 400 uses the leadframe used in the manufacturing method of the electronic device 300. After preparing the film 30, the semiconductor chip 5 with the adhesive tape 8 affixed thereto is placed in the region between the position where the copper post 3a is placed on the film 30 and the position where the copper post 3b is placed on the film 30. By affixing the adhesive tape 8 to the semiconductor chip 5 in this manner, it is possible to prevent the semiconductor chip 5 from being exposed on the lower surface of the electronic device 400 without providing the die pad 4.

Fifth Exemplary Embodiment

Figure 8A:
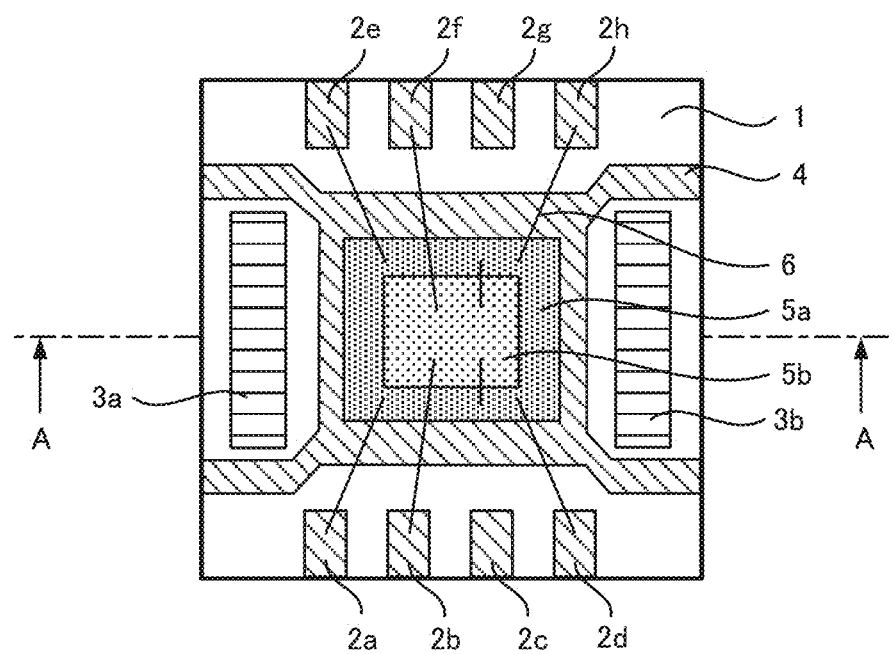
FIGS. 8A and 8B are internal configuration diagrams of the electronic device according to a fifth exemplary embodiment.
Figure 8B:
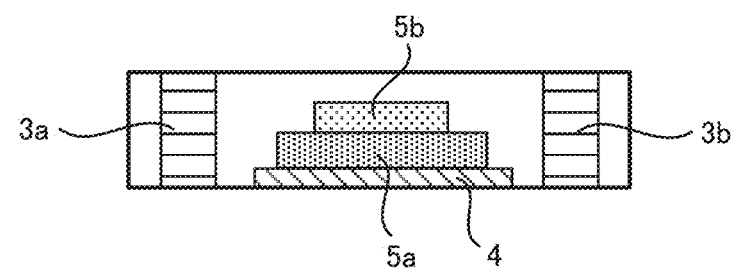

FIGS. 8A and 8B are diagrams for describing an internal configuration of an electronic device 500 according to a fifth exemplary embodiment. FIG. 8A is a schematic perspective view showing an inside configuration of the electronic device 500 as seen from the upper surface side thereof. FIG. 8B is a cross-sectional view of the electronic device 500 taken along line A-A.

The electronic device 500 is different from the electronic device 100 shown in FIGS. 2A and 2B in that it includes a semiconductor chip 5a and a semiconductor chip 5b that is provided on the upper surface of the semiconductor chip 5a as a semiconductor chip 5, and is the same in other respects. In the manufacturing method of the electronic device 500, the semiconductor chip 5a is first placed on the die pad region 4a in the step of placing the semiconductor chip 5 on the die pad 4. And then, the semiconductor chip 5b is place on the semiconductor chip 5a. The electronic device 500 has the semiconductor chips 5a and 5b in this manner, and so it is possible to accommodate a plurality of semiconductor chips having different characteristics requiring different design rules in one package, thereby achieving miniaturization of the apparatus.

Sixth Exemplary Embodiment

Figure 9A:
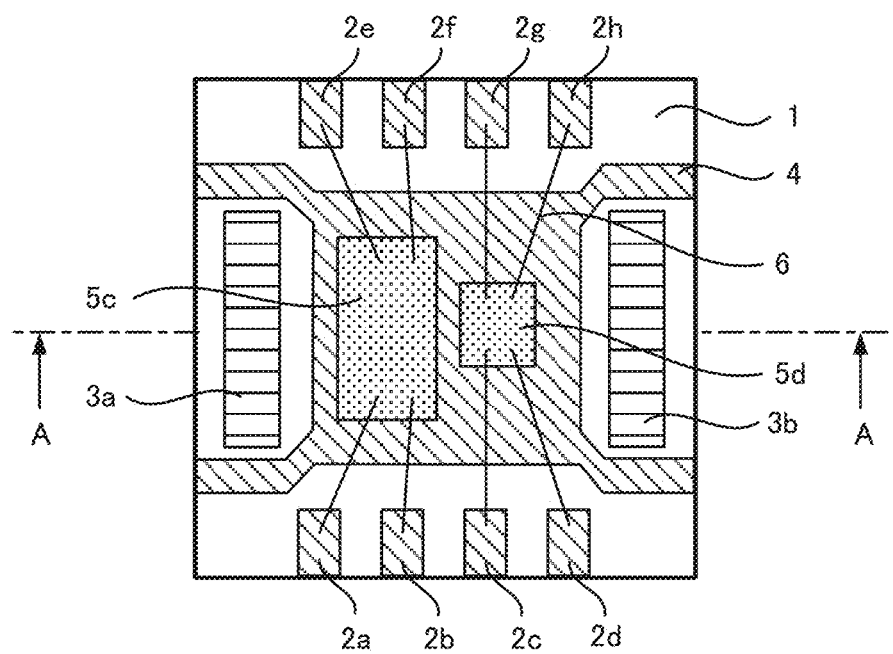
FIGS. 9A and 9B are internal configuration diagrams of the electronic device according to a sixth exemplary embodiment.
Figure 9B:
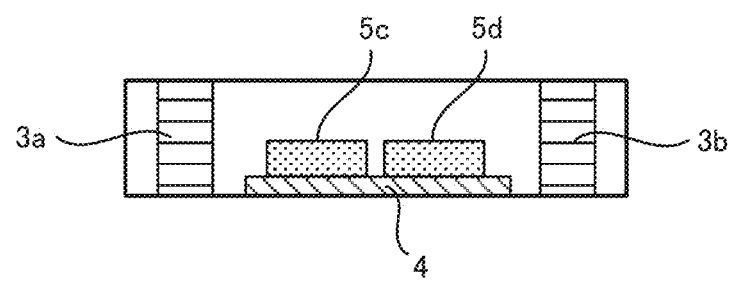

FIGS. 9A and 9B are diagrams for describing an internal configuration of an electronic device 600 according to a sixth exemplary embodiment. FIG. 9A is a schematic perspective view showing an inside configuration of the electronic device 600 as seen from the upper surface side thereof. FIG. 9B is a cross-sectional view of the electronic device 600 taken along line A-A.

The electronic device 600 is different from the electronic device 100 shown in FIGS. 2A and 2B in that it includes a semiconductor chip 5c and a semiconductor chip 5d that is provided next to the semiconductor chip 5c as a semiconductor chip 5, and is the same in other respects. In the manufacturing method of the electronic device 600, the semiconductor chip 5c and the semiconductor chip 5d are placed on the die pad region 4a simultaneously or sequentially in the step of placing the semiconductor chip 5 on the die pad 4. The electronic device 600 has the semiconductor chips 5c and 5d in this manner, and so it is possible to accommodate a plurality of semiconductor chips having different characteristics requiring different design rules in one package, like the electronic device 500, thereby achieving miniaturization of the apparatus.

Seventh Exemplary Embodiment

Figure 10A:
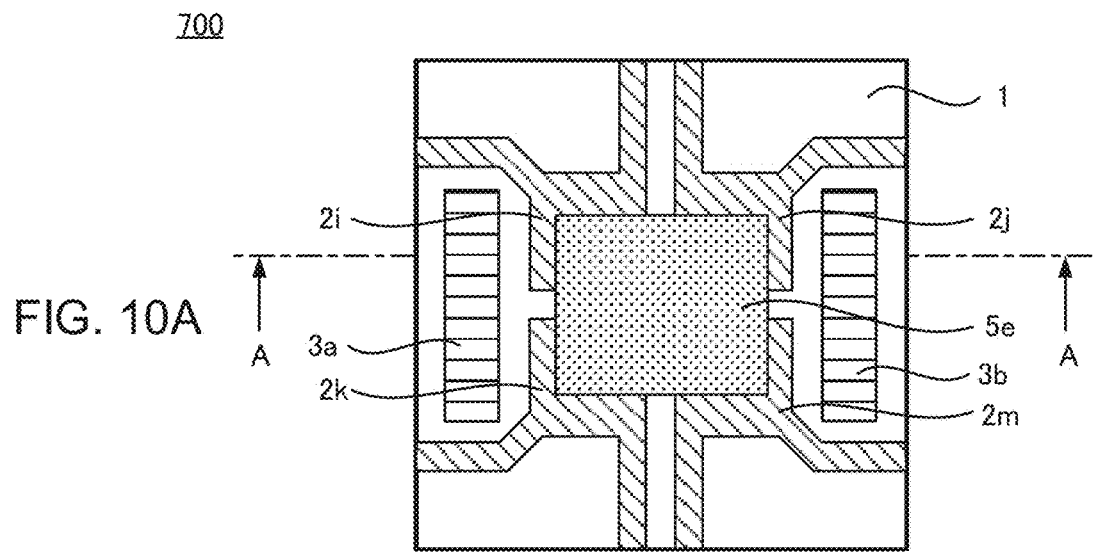
FIGS. 10A to 10D are internal configuration diagrams of the electronic device according to a seventh exemplary embodiment.
Figure 10B:
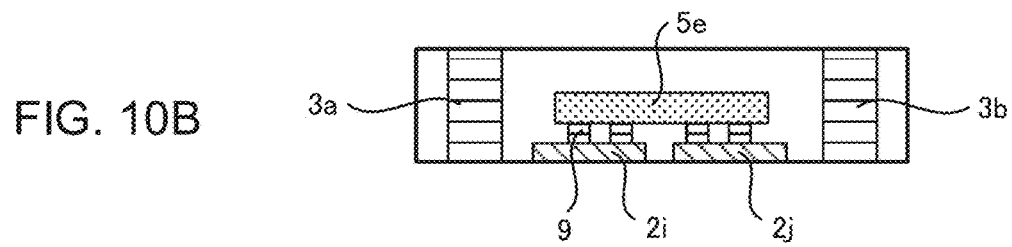
Figure 10C:
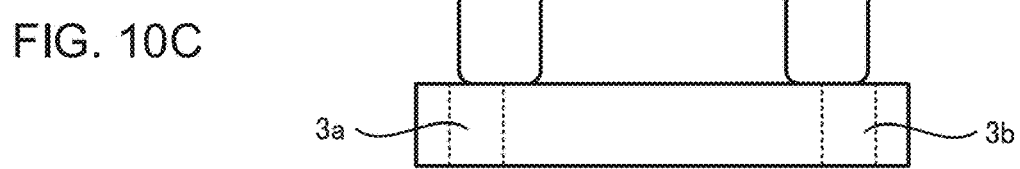
Figure 10D:
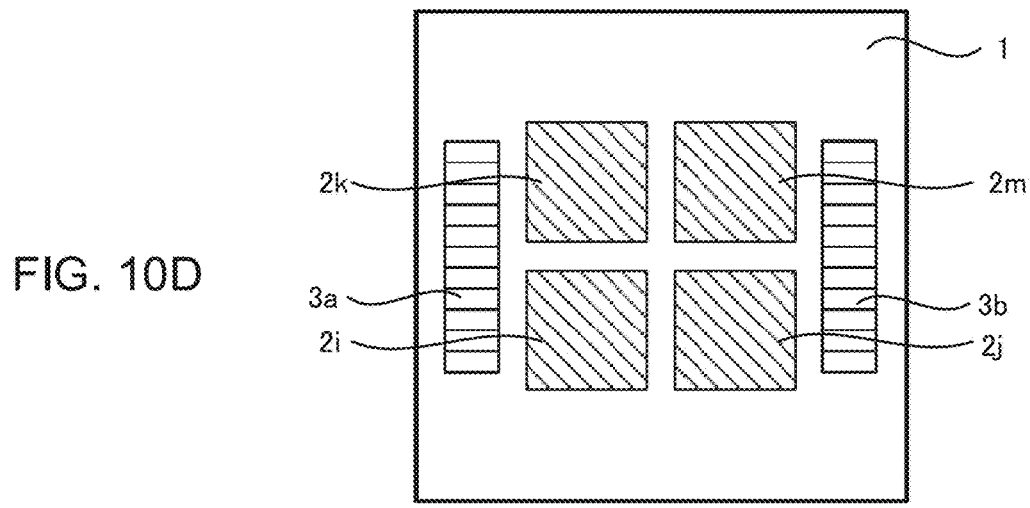

FIGS. 10A to 10D are diagrams for describing an internal configuration of an electronic device 700 according to a seventh exemplary embodiment. FIG. 10A is a schematic perspective view showing an inside configuration of the electronic device 700 as seen from the upper surface side thereof. FIG. 10B is a cross-sectional view of the electronic device 700 taken along line A-A. FIG. 10C is a side view showing a state where the electronic component 10 is mounted on the electronic device 700. FIG. 10D is a lower surface view of the electronic device 700.

The electronic device 700 includes a terminal 2i, a terminal 2j, a terminal 2k, and a terminal 2m (hereafter, referred to as the terminals 2i to 2m) as the plurality of terminals 2. The terminals 2i to 2m are unexposed on the side surfaces of the package 1 but are exposed near the center of the lower surface of the package 1. The terminals 2i to 2m have regions for placing the semiconductor chip 5e between the copper post 3a and the copper post 3b. A pad surface of the semiconductor chip 5e faces the lower surface side of the package 1 and is flip-chip mounted. Specifically, as shown in FIG. 10B, the semiconductor ship 5e is fixed to the terminals 2i to 2m via solder bumps 9 fixed to the terminals 2i to 2m by using an adhesive.

As shown in FIG. 10C, the terminals are unexposed on the side surfaces of the electronic device 700 when the semiconductor chip 5e is flip-chip mounted on the die pad 4. As shown in FIG. 10D, the square shaped terminals 2i to 2m are exposed on the lower surface of the electronic device 700. In the present exemplary embodiment, the surface area of the terminals 2i to 2m is assumed to be smaller than the cross-sectional area of the copper post 3a and the copper post 3b, but the surface area of the terminals 2i to 2m may be equal to or larger than the cross-sectional area of the copper post 3a and the copper post 3b.

Eighth Exemplary Embodiment

Figure 11A:
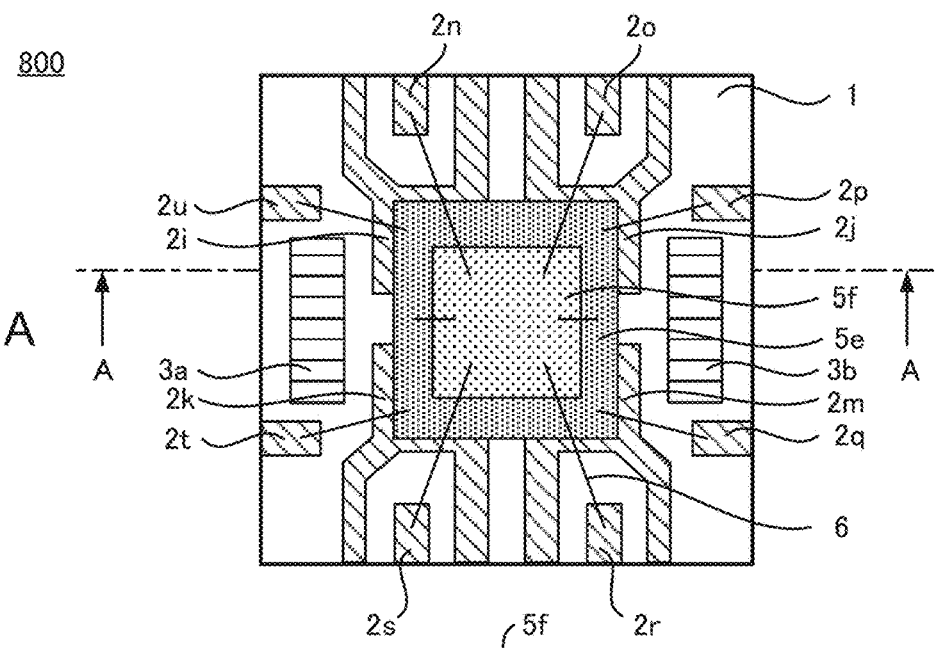
FIGS. 11A to 11D are internal configuration diagrams of the electronic device according to an eighth exemplary embodiment.
Figure 11B:
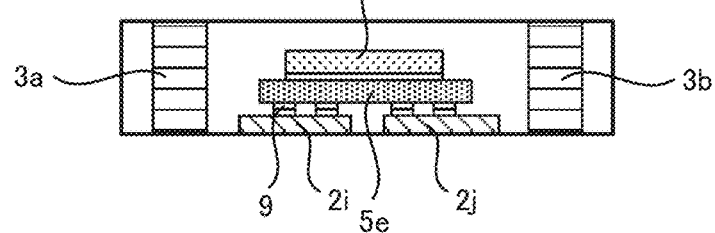
Figure 11C:
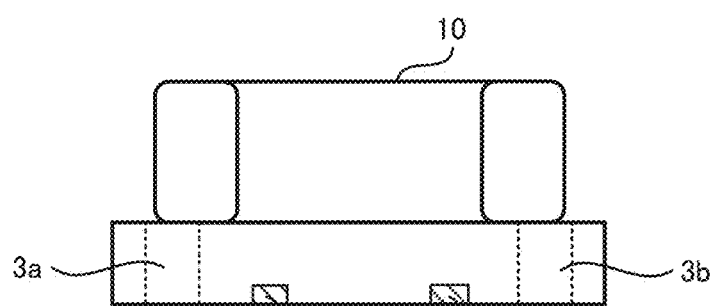
Figure 11D:
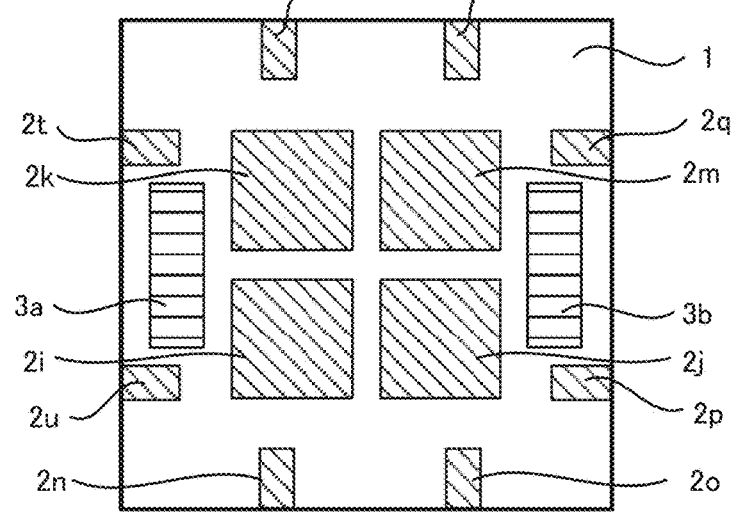

FIG. 11A to 11D are diagrams for describing an internal configuration of an electronic device 800 according to an eighth exemplary embodiment. FIG. 11A is a schematic perspective view showing an inside configuration of the electronic device 800 as seen from the upper surface side thereof. FIG. 11B is a cross-sectional view of the electronic device 800 taken along line A-A.

As shown in FIG. 11A and FIG. 11B, the electronic device 800 includes the semiconductor chip 5e shown in FIG. 10 and a semiconductor chip 5f that is provided on the semiconductor chip 5e. The electronic device 800 has the semiconductor chip 5e that is flip-chip mounted on the terminal 2i, the terminal 2j, the terminal 2k, and the terminal 2m (hereafter, referred to as the terminals 2i to 2m). The electronic device 800 has the semiconductor chip 5e and the semiconductor chip 5f that are wire-bonded to a terminal 2n, a terminal 2o, a terminal 2p, a terminal 2q, a terminal 2r, a terminal 2s, a terminal 2t, and a terminal 2u (hereafter, referred to as the terminals 2n to 2u).

The terminals 2i to 2m shown in FIG. 11A have substantially the same functions as the terminals 2i to 2m shown in FIG. 10A, although they are slightly different in shape from the terminals 2i to 2m shown in FIG. 10A. The terminals 2i to 2m are formed of the same leadframe as the terminals 2n to 2u and are plate-like members made of the same material as the terminals 2n to 2u.

The electronic device 800 includes, in the vicinity of the copper post 3a and the copper post 3b, i) the terminals 2i to 2m on which the semiconductor chip 5e is flip-chip mounted and ii) the terminals 2n to 2u to which the semiconductor chip 5e and the semiconductor chip 5f are wire-bonded in this manner, and so various semiconductor chips can be mounted inside of the electronic device 800. Further, since a large number of terminals can be provided in the electronic device 800, a multifunction device can be miniaturized.

Ninth Exemplary Embodiment

Figure 12A:
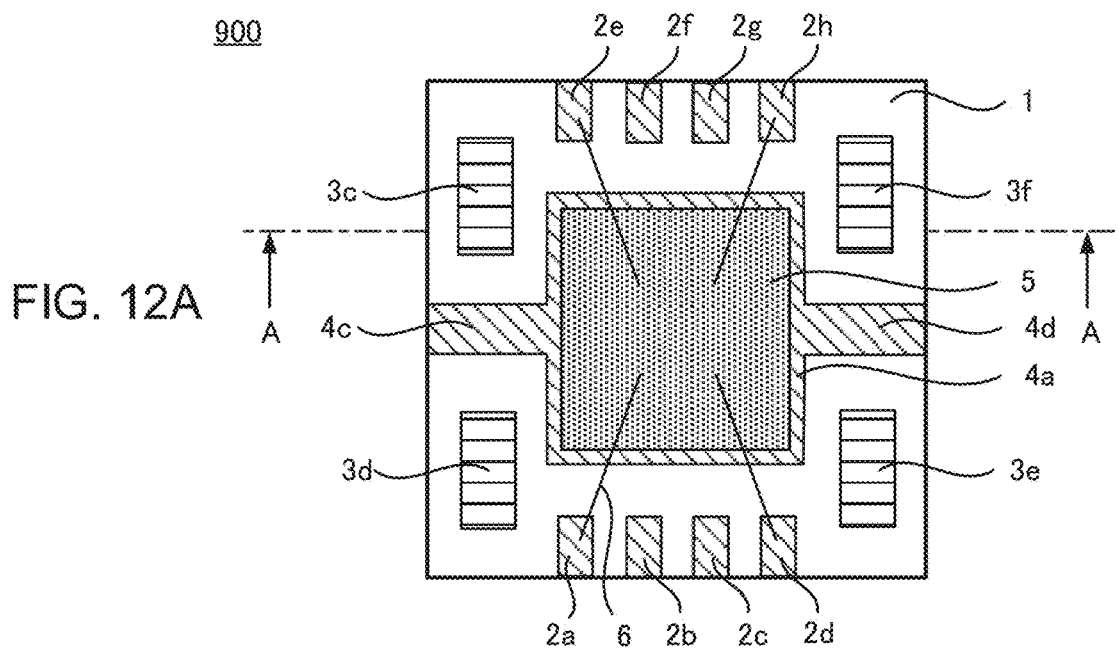
FIGS. 12A to 12D are internal configuration diagrams of the electronic device according to a ninth exemplary embodiment.
Figure 12B:
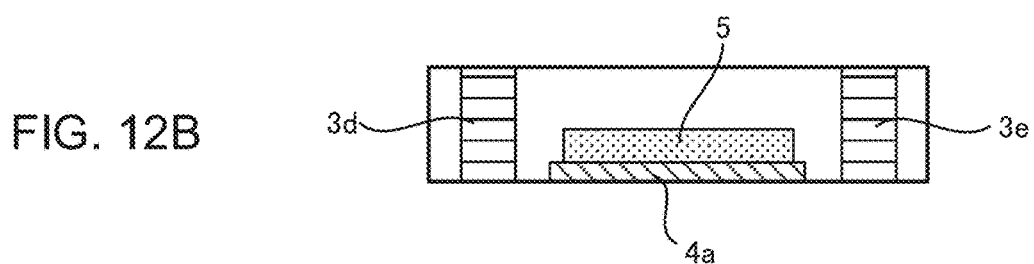

FIGS. 12A to 12D are diagrams for describing an internal configuration of an electronic device 900 according to a ninth exemplary embodiment. FIG. 12A is a schematic perspective view showing an inside configuration of the electronic device 900 as seen from the upper surface side thereof. FIG. 12B is a cross-sectional view of the electronic device 900 taken along line A-A.

As shown in FIG. 12A, the electronic device 900 has the copper post 3c and the copper post 3d on a third side, and the copper post 3e and the copper post 3f on a fourth side. The third side and the fourth side are the sides different from the first side on which the terminals 2a to 2d are provided and the second side on which the terminals 2e to 2h are provided. The die pad 4 that is provided with the semiconductor chip 5 is formed to include the die pad region 4a (a first region) where the semiconductor chip 5 is placed, the separation part 4c (a second region) for separating the copper post 3c and the copper post 3d on the third side, and the separation region 4d (a third region) for separating the copper post 3e and the copper post 3f on the fourth side. The separation region 4c and the separation region 4d are half-etched and are thinner than the die pad region 4a. Thus, the separation region 4c and the separation region 4d are unexposed on the lower surface of the electronic device 900.

Figure 12C:
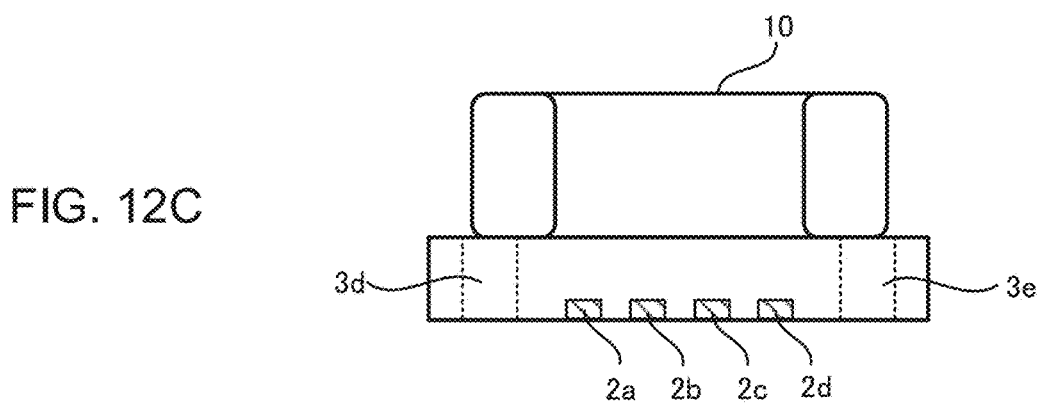
Figure 12D:
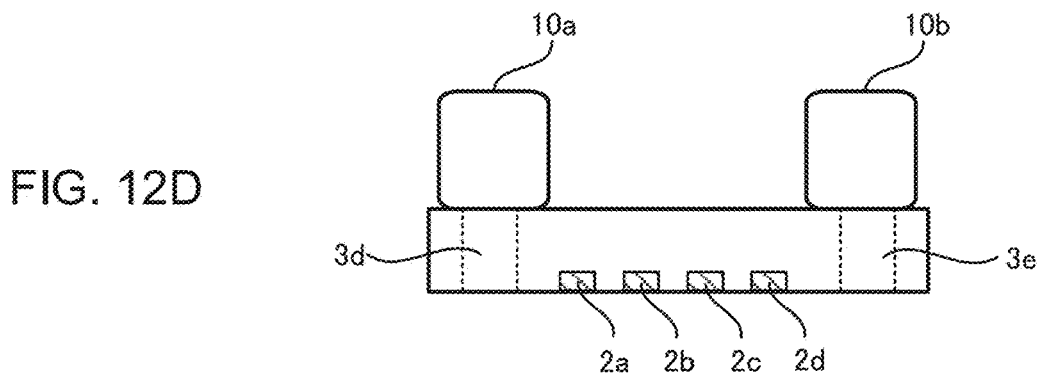

FIG. 12C shows the state where the electronic component 10 is mounted between the copper post 3d and the copper post 3e. FIG. 12D shows the state where an electronic component 10a is mounted between the copper post 3c and the copper post 3d, and where an electronic component 10b is mounted between the copper post 3e and the copper post 3f. The electronic device 900 includes the plurality of copper posts 3 on each of the third side and the fourth side in this manner, and so the plurality of electronic components 10 can be mounted on the upper surface of the electronic device 900. Thus, the configuration of the electronic device 900 enables a circuit to have more functions.

Tenth Exemplary Embodiment

Figure 13A:
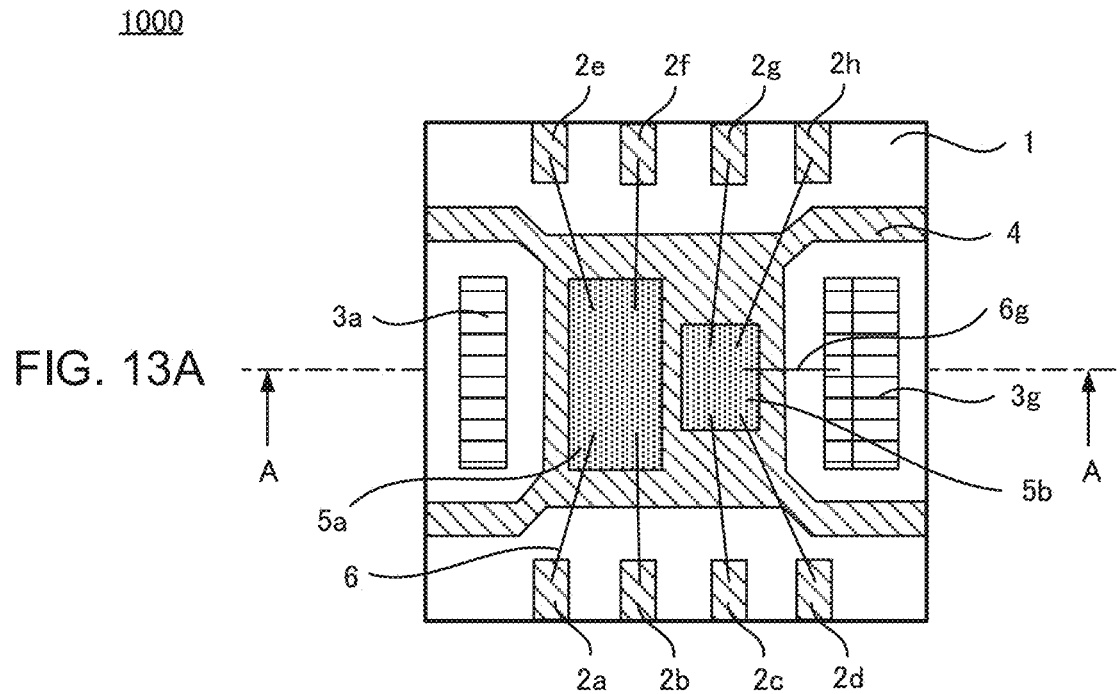
FIGS. 13A to 13C are internal configuration diagrams of the electronic device according to a tenth exemplary embodiment.
Figure 13B:
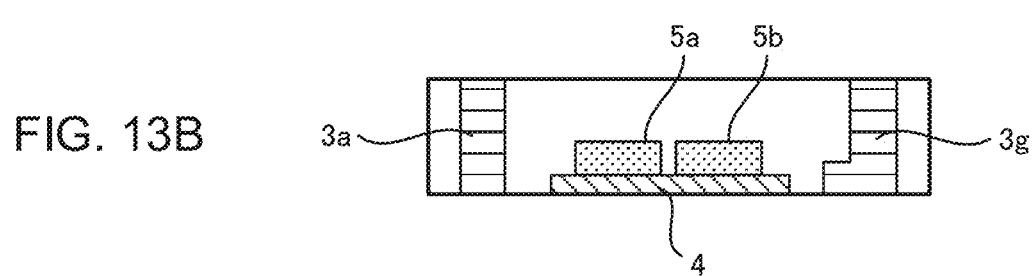
Figure 13C:
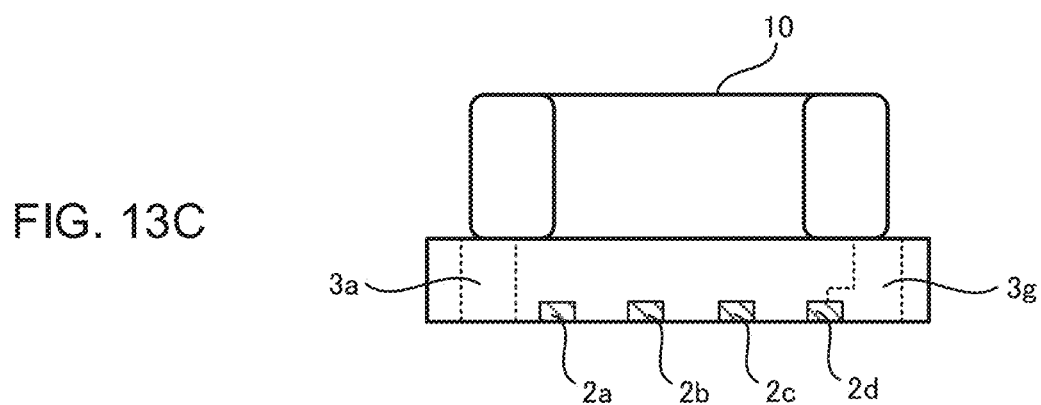

FIGS. 13A to 13C are diagrams for describing an internal configuration of an electronic device 1000 according to a tenth exemplary embodiment. FIG. 13A is a schematic perspective view showing an inside configuration of the electronic device 1000 as seen from the upper surface side thereof. FIG. 13B is a cross-sectional view of the electronic device 1000 taken along line A-A.

The electronic device 1000 shown in FIGS. 13A to 13C are different from the electronic device 600 in that it includes a copper post 3g in place of the copper post 3b of the electronic device 600 shown in FIGS. 9A and 9B, and is substantially the same as the electronic device 600 in other respects. The copper post 3g includes a first region that penetrates from the lower surface to the upper surface of the electronic device 1000, and a second region that is exposed on the lower surface but does not penetrate to the upper surface. Also, the semiconductor chip 5b and the second region of the copper post 3g are connected by a bonding wire 6g.

The electronic device 1000 includes the bonding wire 6g that bonds the semiconductor chip 5b and the copper post 3g in this manner. Thus, the electronic component 10 mounted on the upper surface of the electronic device 1000 and the semiconductor chip 5b in the electronic device 1000 can be electrically connected.

Eleventh Exemplary Embodiment

Figure 14A:
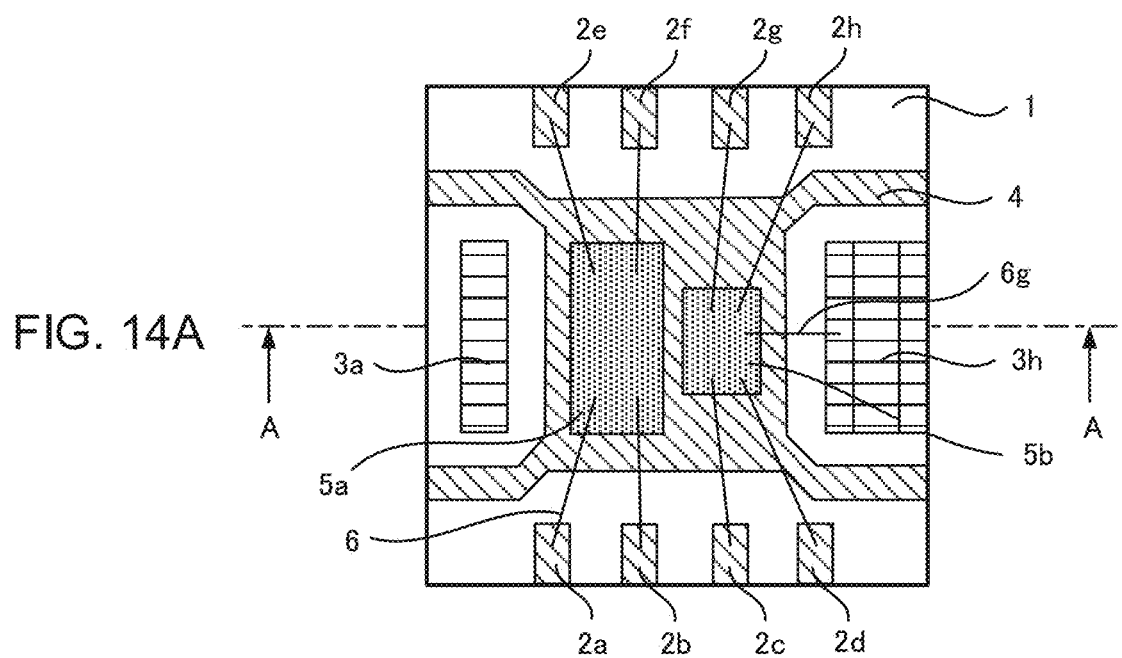
FIGS. 14A to 14C are internal configuration diagrams of the electronic device according to an eleventh exemplary embodiment.
Figure 14B:
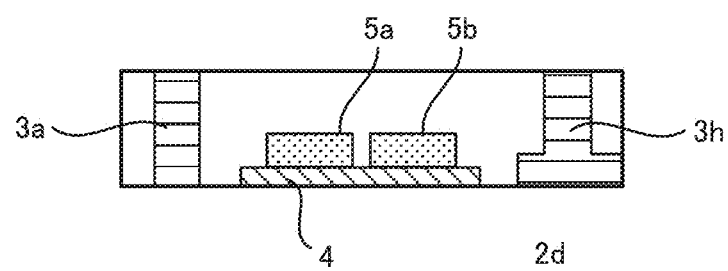
Figure 14C:
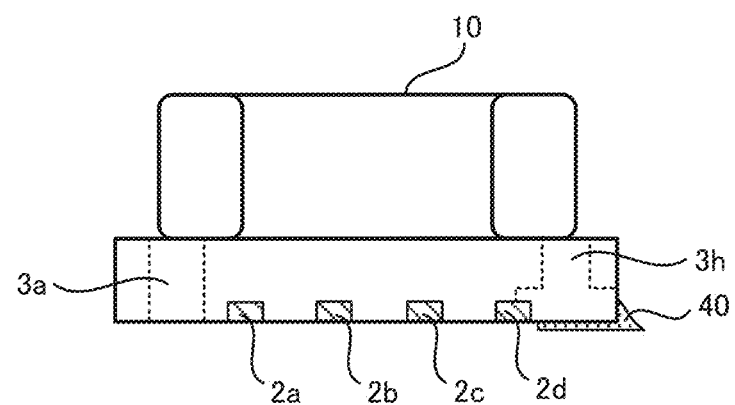

FIGS. 14A to 14C are diagrams for describing an internal configuration of an electronic device 1100 according to an eleventh exemplary embodiment. FIG. 14A is a schematic perspective view showing an inside configuration of the electronic device 1100 as seen from the upper surface side thereof. FIG. 14B is a cross-sectional view of the electronic device 1100 taken along line A-A.

The electronic device 1100 is different from the electronic device 1000 in that it includes a copper post 3h in place of the copper post 3g shown in FIGS. 13A to 13C, and is the same in other respects. The copper post 3h has a T-shaped cross-sectional shape in the vertical direction, and the tip of a portion that does not penetrate the package 1 from the lower surface to the upper surface is exposed on a side surface of the package 1. Since the tip of the portion of the copper post 3h having a small thickness is exposed on the side surface of the package 1 in this manner, the fillet is formed when the electronic device 1100 is solder-mounted on a printed circuit board as shown in FIG. 14C, and so it can also be used for a vehicle-mounted product.

Twelfth Exemplary Embodiment

Figure 15A:
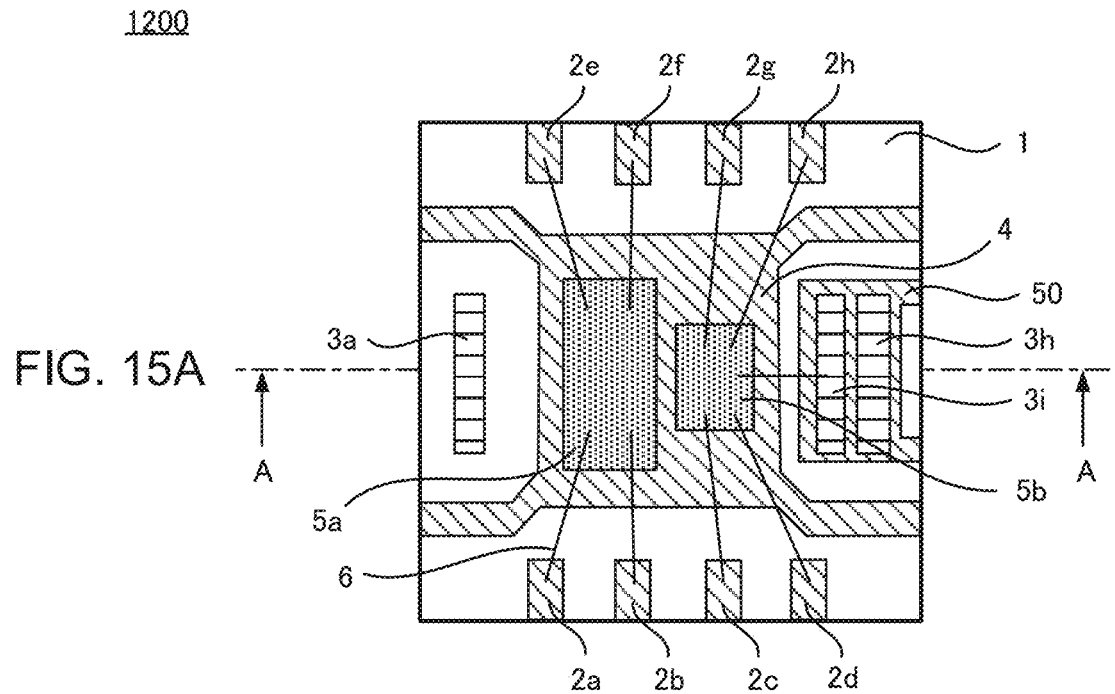
FIGS. 15A to 15C are internal configuration diagrams of the electronic device according to a twelfth exemplary embodiment.
Figure 15B:
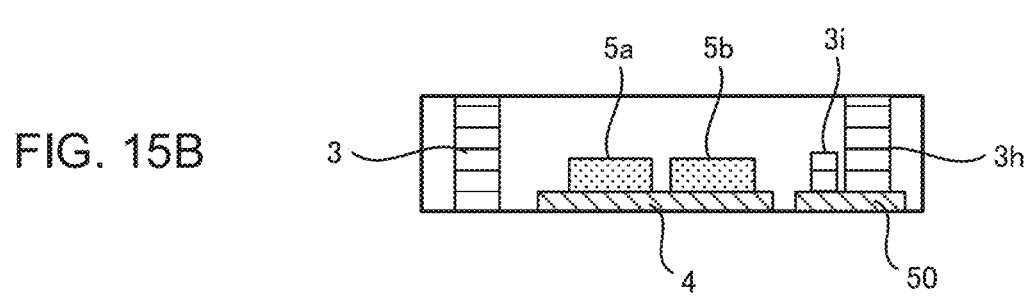
Figure 15C:
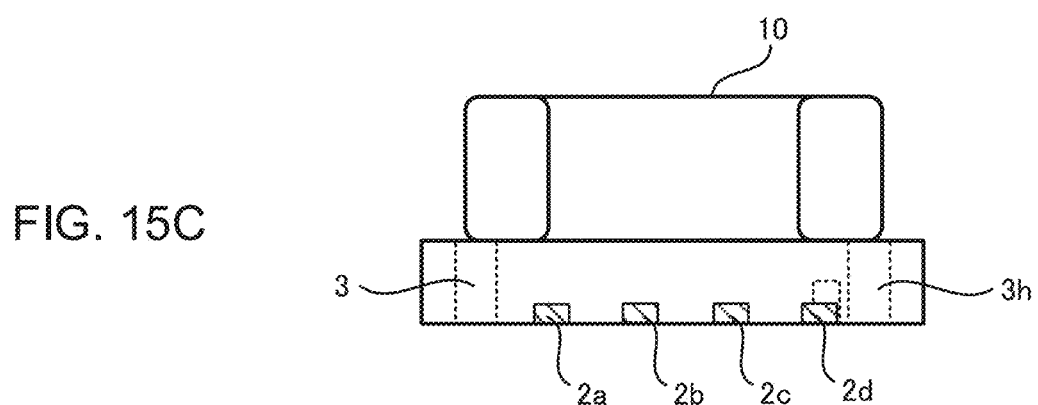

FIGS. 15A to 15C are diagrams for describing an internal configuration of an electronic device 1200 according to a twelfth exemplary embodiment. FIG. 15A is a schematic perspective view showing an inside configuration of the electronic device 1200 as seen from the upper surface side thereof. FIG. 15B is a cross-sectional view of the electronic device 1200 taken along line A-A.

As shown in FIG. 15A, the electronic device 1200 further includes, in addition to the die pad 4 that is the first plate-like member included in the electronic device 600 shown in FIGS. 9A and 9B, a second plate-like member 50 made of the same material as the terminal 2 and the die pad 4. The second plate-like member 50 is exposed on the lower surface of the electronic device 1200. Also, the second plate-like member 50 is provided with the copper post 3h and the copper post 3i. The lower end of the copper post 3h contacts the second plate-like member 50, and the upper end of the copper post 3h is exposed on the upper surface of the electronic device 1200. The lower end of the copper post 3i contacts the second plate-like member 50, and the upper end of the copper post 3i is positioned at a similar height as the semiconductor chip 5b in the electronic device 1100. Also, the copper post 3i is connected to the semiconductor chip 5b by the bonding wire 6.

The die pad 4, the second plate-like member 50, and the plurality of terminals 2 are provided on the same leadframe and are plate-like members separated by dicing. The electronic device 1200 includes the die pad 4 and the second plate-like member 50 that are electrically disconnected from each other, the semiconductor chip 5a and the semiconductor chip 5b are provided on the die pad 4, and the copper post 3h and the copper post 3i are provided on the second plate-like member 50. Because the copper post 3h and the copper post 3i are electrically connected via the second plate-like member 50, the electronic device 1200 can electrically connect the electronic component 10 mounted on the upper surface of the electronic device 1200 and the semiconductor chip 5b in the electronic device 1200 like the electronic device 1000.

Experimental Results

Figure 17:
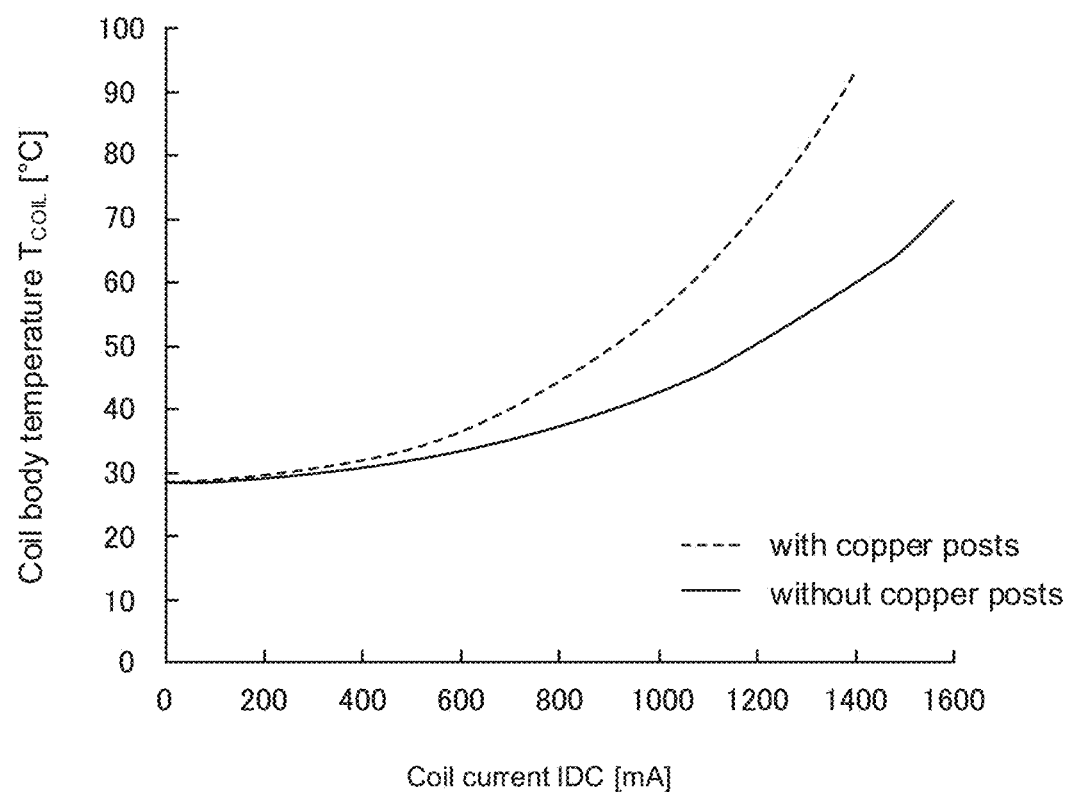
FIG. 17 is a diagram showing experimental results for confirming heat dissipation properties of the electronic device.

FIG. 17 is a diagram showing experimental results for confirming heat dissipation properties of the electronic device 100 shown in FIG. 2. FIG. 17 shows the result of comparing the electronic device 100 having the copper post 3 and an electronic device 2000 having no copper post.

Experiment Contents

The surface temperatures of inductors were measured in a condition where the inductors were in a conducting state, each inductor being placed on the upper surfaces of the electronic device 100 and the electronic device 2000. Specifically, a current was not fed to the semiconductor chip 5 incorporated in the electronic device 100 and the semiconductor chip 5 incorporated in the electronic device 2000, and a current was fed to the inductors via a pattern of a printed circuit board, on which the electronic device 100 was mounted, and via a copper wire in a state where the inductors (TFM252012_4R7 manufactured by TDK Corporation) were mounted on the upper surfaces of the electronic device 100 and the electronic device 2000. Changes in the surface temperatures of the inductors were measured when the current flowing through the inductors was varied from 0 [mA] to 1600 [mA].

Examination of Experiment Results

In FIG. 17, the horizontal axis represents the current value flowing through the inductors, and the vertical axis represents the surface temperature of the inductors. The solid line shows the change in the surface temperature of the electronic device 100 having the copper post 3, and the broken line shows the change in the surface temperature of the electronic device 2000 having no copper post.

The temperature of the electronic device 2000 having no copper post is 90° C. or more when the current value reaches 1400 [mA]. On the other hand, the temperature of the electronic device 100 is about 60° C. when the current value reaches 1400 [mA], and the temperature of the electronic device 100 is significantly lower than that of the electronic device 2000. This temperature difference is thought to be due to the electronic device 100 having the copper post 3. From the experimental results, it could be confirmed that miniaturization could be achieved because the electronic device 100 had the copper post 3 having a large cross-sectional area, thereby improving the heat dissipation when an electronic element that allows a large current to flow is mounted.

Summary

As described above, the electronic device according to the present exemplary embodiment includes the plurality of terminals 2, which is electrically connected to the semiconductor chip 5 and exposed on the lower surface of the package 1, and the copper post 3, which penetrates from the lower surface to the upper surface of the package 1 and has a cross-sectional area larger than the area of the terminal 2. Since the cross-sectional area of the copper post 3 is large, the electric resistance is smaller as compared with the configuration in which conventional through-holes penetrate a circuit board or the configuration in which the copper post 3 having a similar cross sectional area as the terminal 2 is used. Because the electronic device has such a configuration, the amount of heat generated by the electric resistance is small and the heat dissipation property is high, and so it is possible to achieve miniaturization of the electronic device on which the electronic element that allows a large current to flow is mounted.

It should be noted that, even when the size of the cross-sectional area of the copper post 3 is set to be approximately the same as that of the terminal 2, the following effects are obtained because the copper post 3 is not connected to the leadframe in the process of manufacturing the electronic device. All terminals in a leadframe used for manufacturing conventional semiconductor packages were connected to a vertical crossbar or a horizontal crossbar of the leadframe via the hanger lead. Then, the semiconductor package was manufactured by cutting a hanger lead in a dicing process after injecting resin as a housing of the package. Thus, a part of the terminal exposed on the upper surface of the package was exposed on a side surface of the package.

When a partial region of the terminal exposed on the upper surface of the package was exposed on the side surface of the package, a signal to be supplied to the electronic device mounted on the upper surface of the package also appeared on the side surface of the package. As a result, it was necessary to secure a sufficient distance between the package and other adjacent electronic devices, and the distance hindered miniaturization of the apparatus on which the package was mounted.

On the other hand, in the electronic device according to the present exemplary embodiment whose copper post 3 is unexposed on the side surfaces of the package, the current that flows through the copper post 3 has little influence on other nearby electronic devices. Thus, it is possible to increase the mounting density of the electronic devices in the apparatus by using the electronic device according to the above exemplary embodiment.

Further, allowing electronic components to be mounted on the copper post 3 eliminates the need for designing and manufacturing a leadframe for each type of built-in electronic component, unlike the case where electronic components are built in the electronic device. Furthermore, electronic components having the same characteristics and different shapes can be used by changing the position and cross-sectional area of the copper post 3. Thus, electronic components can be mounted on the copper post 3, which is not connected to the leadframe at the time of manufacturing, and the degree of freedom in designing and manufacturing the electronic device is improved.

The exemplary embodiments of the present invention are not limited to the first to twelfth exemplary embodiments, and the present invention can be applied to various embodiments. FIG. 16 is a table showing an example of the scope of application of the present invention. As a mounting method of a semiconductor chip, it is possible to adopt various mounting methods such as mounting with a die attach film, mounting in a chip-stack form, mounting in a multi-chip package (MCP) form, and flip-chip (FC) mounting. It should be noted that the forms other than the flip-chip mounting can be applied to both the configuration having the die pad (DP) and the configuration having no die pad.

As a form of the copper post 3, it is possible to adopt a configuration having a pair of copper posts for mounting one electronic element and a configuration having a plurality of pairs of copper posts 3 for mounting a plurality of electronic elements. Further, as in the tenth embodiment and the eleventh embodiment, it is also possible to adopt a form in which the semiconductor chip 5 and the copper post 3 are connected by wire bonding.

The present invention is explained with the exemplary embodiments of the present invention but the technical scope of the present invention is not limited to the scope described in the above embodiment. It is apparent for those skilled in the art that it is possible to make various changes and modifications to the embodiment. It is apparent from the description of the scope of the claims that the forms added with such changes and modifications are included in the technical scope of the present invention.

What is claimed is:

1. An electronic device comprising:
   a semiconductor chip;
   an accommodating part that accommodates the semiconductor chip;
   a plurality of terminals that are provided along a first side of a first surface and along a second side opposite to the first side with respect to the semiconductor chip, the plurality of terminals being electrically connected to the semiconductor chip and being exposed on the rectangular first surface of the accommodating part, the rectangular first surface being the side opposite to the side of the accommodating part where the semiconductor chip is placed; and
   a plurality of conductive members that penetrate from the first surface of the accommodating part to the second surface opposite to the first surface, the plurality of conductive members functioning as lands for mounting an electronic component, wherein
the plurality of conductive members are provided at positions closer to a third side and a fourth side where the plurality of terminals electrically connected to the semiconductor chip are not provided than to the positions where the plurality of terminals are provided, the third side and the fourth side being orthogonal to the first side, wherein
- a first conductive member of the plurality of conductive members includes:
  - a first area whose cross-sectional area is a first size and includes a portion exposed on the first surface; and
  - a second area whose cross-sectional area is a second size smaller than the first size and includes a portion exposed on the second surface, and
- a second conductive member of the plurality of conductive members has the cross-sectional area whose size is the same from a side exposing on the first surface to a side exposing on the second surface.

2. The electronic device according to claim 1, wherein the plurality of conductive members, which are not electrically connected to each other, are provided at positions where the distances from the first side and the second side are the same.

3. The electronic device according to claim 1, wherein the plurality of conductive members cross a center position where the distances from the first side and the second side are the same.

4. The electronic device according to claim 1, wherein the plurality of conductive members are provided at positions that are farther from the first side and the second side compared to the positions where the plurality of terminals are provided.

5. The electronic device according to claim 1, wherein one of the conductive members of the plurality of conductive members includes:
- a plate-like member that exposes on the first surface and has the same material as the plurality of terminals; and
- a rod-like member whose cross-sectional area is smaller than the cross-sectional area of the plate-like member.

6. The electronic device according to claim 1, wherein at least one conductive member of the plurality of conductive members is exposed on a side surface of the third side near the first surface and unexposed on a side surface of the third side near the second surface.

7. An electronic device comprising:
- a semiconductor chip;
- an accommodating part that accommodates the semiconductor chip;
- a plurality of terminals that are provided along a first side of a first surface and along a second side opposite to the first side with respect to the semiconductor chip, the plurality of terminals being electrically connected to the semiconductor chip and being exposed on the rectangular first surface of the accommodating part, the rectangular first surface being the side opposite to the side of the accommodating part where the semiconductor chip is placed; and
- a plurality of conductive members that penetrate from the first surface of the accommodating part to the second surface opposite to the first surface, the plurality of conductive members functioning as lands for mounting an electronic component, wherein the plurality of conductive members are provided at positions closer to a third side and a fourth side where the plurality of terminals electrically connected to the semiconductor chip are not provided than to the positions where the plurality of terminals are provided, the third side and the fourth side being orthogonal to the first side, wherein
a first conductive member of the plurality of conductive members is exposed on a side surface of the third side near the first surface and unexposed on a side surface of the third side near the second surface, and
a second conductive member of the plurality of conductive members is provided at a position closer to the fourth side than to the third side and unexposed on a side surface of the fourth side.

8. An electronic device comprising:
a semiconductor chip;
an accommodating part that accommodates the semiconductor chip;
a plurality of terminals that are provided along a first side of a first surface and along a second side opposite to the first side with respect to the semiconductor chip, the plurality of terminals being electrically connected to the semiconductor chip and being exposed on the rectangular first surface of the accommodating part, the rectangular first surface being the side opposite to the side of the accommodating part where the semiconductor chip is placed; and
a plurality of conductive members that penetrate from the first surface of the accommodating part to the second surface opposite to the first surface, the plurality of conductive members functioning as lands for mounting an electronic component, wherein
the plurality of conductive members are provided at positions closer to a third side and a fourth side where the plurality of terminals electrically connected to the semiconductor chip are not provided than to the positions where the plurality of terminals are provided, the third side and the fourth side being orthogonal to the first side, wherein
a first two conductive members of the plurality of conductive members are provided on the third side, each of the first two conductive members being provided on opposite sides with respect to a first separating plate of a die pad located at a center line between the first side and the second side; and
a second two conductive members of the plurality of conductive members are provided on the fourth side, each of the second two conductive members being provided on opposite sides with respect to a second separating plate of the die pad located at the center line, wherein
the first separating plate and the second separating plate are thinner than a plate in a region where a semiconductor is provided.

* * * * *